United States Patent
Treigherman

(10) Patent No.: US 8,358,573 B2
(45) Date of Patent: Jan. 22, 2013

(54) AREA AND POWER EFFICIENT ARCHITECTURES OF TIME DEINTERLEAVER FOR ISDB-T RECEIVERS

(75) Inventor: Philip Treigherman, Newport Beach, CA (US)

(73) Assignee: Newport Media, Inc., Lake Forest, CA (US)

( * ) Notice: Subject to any disclaimer, the term of this patent is extended or adjusted under 35 U.S.C. 154(b) by 408 days.

(21) Appl. No.: 12/779,630

(22) Filed: May 13, 2010

(65) Prior Publication Data

US 2010/0220242 A1 Sep. 2, 2010

Related U.S. Application Data

(62) Division of application No. 12/015,035, filed on Jan. 16, 2008, now Pat. No. 7,764,595.

(51) Int. Cl.
*H04J 11/00* (2006.01)
(52) U.S. Cl. .......................... 370/208; 725/105; 711/127
(58) Field of Classification Search .................. 370/203, 370/208; 725/105; 711/127
See application file for complete search history.

(56) References Cited

U.S. PATENT DOCUMENTS

| | | | |
|---|---|---|---|
| 2004/0258170 A1 | 12/2004 | Lin et al. | |
| 2007/0115960 A1* | 5/2007 | Yin | 370/389 |
| 2007/0140292 A1* | 6/2007 | Sestok et al. | 370/465 |
| 2007/0250742 A1* | 10/2007 | Kowalski | 714/701 |
| 2008/0123515 A1 | 5/2008 | Boehlke et al. | |
| 2009/0016454 A1* | 1/2009 | Zhong et al. | 375/260 |
| 2009/0080545 A1* | 3/2009 | Nicolas | 375/260 |
| 2010/0235706 A1* | 9/2010 | Eberlein et al. | 714/752 |

* cited by examiner

*Primary Examiner* — Brian D Nguyen
(74) *Attorney, Agent, or Firm* — Rahman LLC

(57) ABSTRACT

A method and apparatus for de-interleaving interleaved data in a deinterleaver memory in an Orthogonal Frequency Division Multiplexing (OFDM) based Integrated Services Digital Broadcasting Terrestrial (ISDB-T) receiver. In different embodiments, the apparatus comprises of a OFDM symbol counter along with a divider or a buffer pointer RAM with circular pointer logic, a first lookup table to obtain delay buffer size and interleaving lengths for a given OFDM transmission layer, and a second lookup table to obtain buffer base address and interleaving lengths for a given OFDM transmission layer.

20 Claims, 6 Drawing Sheets

AREA AND POWER EFFICIENT ARCHITECTURES OF TIME DEINTERLEAVER FOR ISDB-T RECEIVERS

CROSS-REFERENCE TO RELATED APPLICATION

This application is a divisional of U.S. patent application Ser. No. 12/015,035 filed on Jan. 16, 2008, now issued as U.S. Pat. No. 7,764,595, the contents of which, in its entirely, is herein incorporated by reference.

BACKGROUND

1. Technical Field

The embodiments herein generally relate to communication systems, and more particularly to the field of de-interleaving interleaved data in orthogonal frequency division multiplexing (OFDM) communication systems, such as integrated services digital broadcasting terrestrial (ISDB-T) systems.

2. Description of the Related Art

In various communication systems, data gets distorted by channel impairments like fading, multipath prorogations, interference, Doppler Effect, etc. In case of small errors the altered bits can be corrected easily by using error correction codes, but in case of burst errors, higher numbers of data bits are altered and the transmitted data typically cannot be recovered completely. Time interleaving is performed by spreading coded symbols in time before transmission to protect data from burst errors.

OFDM based communication systems, such as ISDB-T use time interleaving to randomize modulated symbol data in the time domain in order to ensure robustness against fading interference and channel impairments. ISDB-T is used to provide many services such as data broadcasting, high definition television (HDTV), interactive TV, mobile applications, etc. ISDB-T was designed keeping in mind a mobile reception. De-interleaving requires a large memory due to the deinterleaver delay buffer and therefore, in general, the deinterleaver designs are random access memory (RAM) based. In RAM based designs, implementation of large number of memory pointers may lead to large number of counters. Such counters are generally implemented as flip-flops leading to a larger deinterleaver area and thereby resulting in greater power consumption. Hence, it would be desirable to reduce the deinterleaver area and reduce the complexity of deinterleaver design.

SUMMARY

In view of the foregoing, an embodiment herein provides an apparatus for de-interleaving interleaved data in an OFDM based ISDB-T receiver comprising of a deinterleaver memory; a OFDM symbol counter incrementing once for each OFDM symbol, wherein a practical bit width of the OFDM symbol counter is in the range of 25 bits (less conservative) to 30 bits (more conservative); a divider for calculating intra buffer offset in the deinterleaver memory for every increment of the OFDM symbol counter; a first lookup table in the deinterleaver memory for obtaining delay buffer sizes for various carriers and interleaving lengths for a given OFDM transmission layer; and a second lookup table in the deinterleaver memory for obtaining buffer base addresses for various carriers and interleaving lengths for a given OFDM transmission layer, where the bit width of the OFDM symbol counter is selected based on uninterrupted television viewing time on a particular channel.

The divider may be embodied as a combinational divider or a sequential divider. The first and second lookup tables are preferably stored in a read-only memory (ROM). Also, the first and second lookup tables may be implemented using dynamic arithmetic calculations. Preferably, the delay buffer sizes and the buffer base addresses are obtained from the first and second lookup tables for corresponding carriers and interleaving lengths for a given OFDM transmission layer.

Another embodiment, as disclosed herein, provides an apparatus for de-interleaving interleaved data in an OFDM based ISDB-T receiver comprising of a deinterleaver memory; a buffer pointer RAM adapted to store buffer pointer values, with the buffer pointer RAM using circular pointer increment logic; a first lookup table in the deinterleaver memory for obtaining delay buffer sizes for various carriers and interleaving lengths for a given OFDM transmission layer; and a second lookup table in the deinterleaver memory for obtaining buffer base addresses for various carriers and interleaving lengths for a given OFDM transmission layer, where the buffer pointer RAM size is chosen based on practical uninterrupted television viewing time on a particular channel. The buffer pointer RAM may comprise a 95×11 RAM. Moreover, the first and second lookup tables are implemented as a ROM. Preferably, the first and second lookup tables are implemented using dynamic arithmetic calculations.

Furthermore, an embodiment herein provides a method of de-interleaving interleaved data on a deinterleaver memory component in an OFDM based ISDB-T receiver using a buffer pointer random access memory (RAM) and circular pointer logic, a first lookup table to obtain delay buffer sizes for various carriers and interleaving lengths for a given OFDM transmission layer, and a second lookup table to obtain buffer base address and interleaving lengths for a given OFDM transmission layer, the method having the steps of reading a pointer value for a corresponding carrier from the buffer pointer RAM; incrementing the above read pointer value; retrieving a buffer size value for said corresponding carrier from the first lookup table; calculating intra buffer offset for a carrier by comparing said buffer size with the incremented pointer value; retrieving a buffer base address value for corresponding carrier from the second lookup table; adding calculated intra buffer offset to the buffer base address to calculate a memory address to store carrier data bits of the corresponding carrier; and storing the carrier data bits at the calculated memory address.

The RAM buffer pointer may comprise 96 stored pointer values. Also, the divider may be any of a combinational divider and a sequential divider. Moreover, the first and second lookup tables may be implemented as a ROM. Furthermore, the first and second lookup tables may be implemented using dynamic arithmetic calculations. Preferably, the delay buffer sizes and buffer base addresses are obtained for various carriers and interleaving lengths for a given OFDM transmission layer from the first and second lookup table respectively.

Also another embodiment, as disclosed herein, provides a method of de-interleaving interleaved data in a deinterleaver memory in an OFDM based ISDB-T receiver comprising of a OFDM symbol counter, a divider, a first lookup table to obtain delay buffer size and interleaving lengths for a given OFDM transmission layer, and a second lookup table to obtain buffer base address and interleaving lengths for a given OFDM transmission layer, the method performing the steps of counting received symbols by incrementing the OFDM symbol counter, where the OFDM symbol counter comprises a bit width in the range of 25 to 30 bits; retrieving a delay buffer size value for a corresponding carrier from the first lookup table; calculating intra buffer offset by dividing the OFDM symbol counter with the delay buffer size of corresponding carrier; retrieving a buffer base address for corresponding carrier from the second lookup table; combining the intra buffer offset and the buffer base address to calculate a memory address to store corresponding carrier data bits; and storing the carrier data bits at the calculated memory address. The method may further comprise implementing the first and second lookup tables as a ROM. Moreover, the method may further comprise implementing the first and second lookup tables as dynamic arithmetic calculations.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
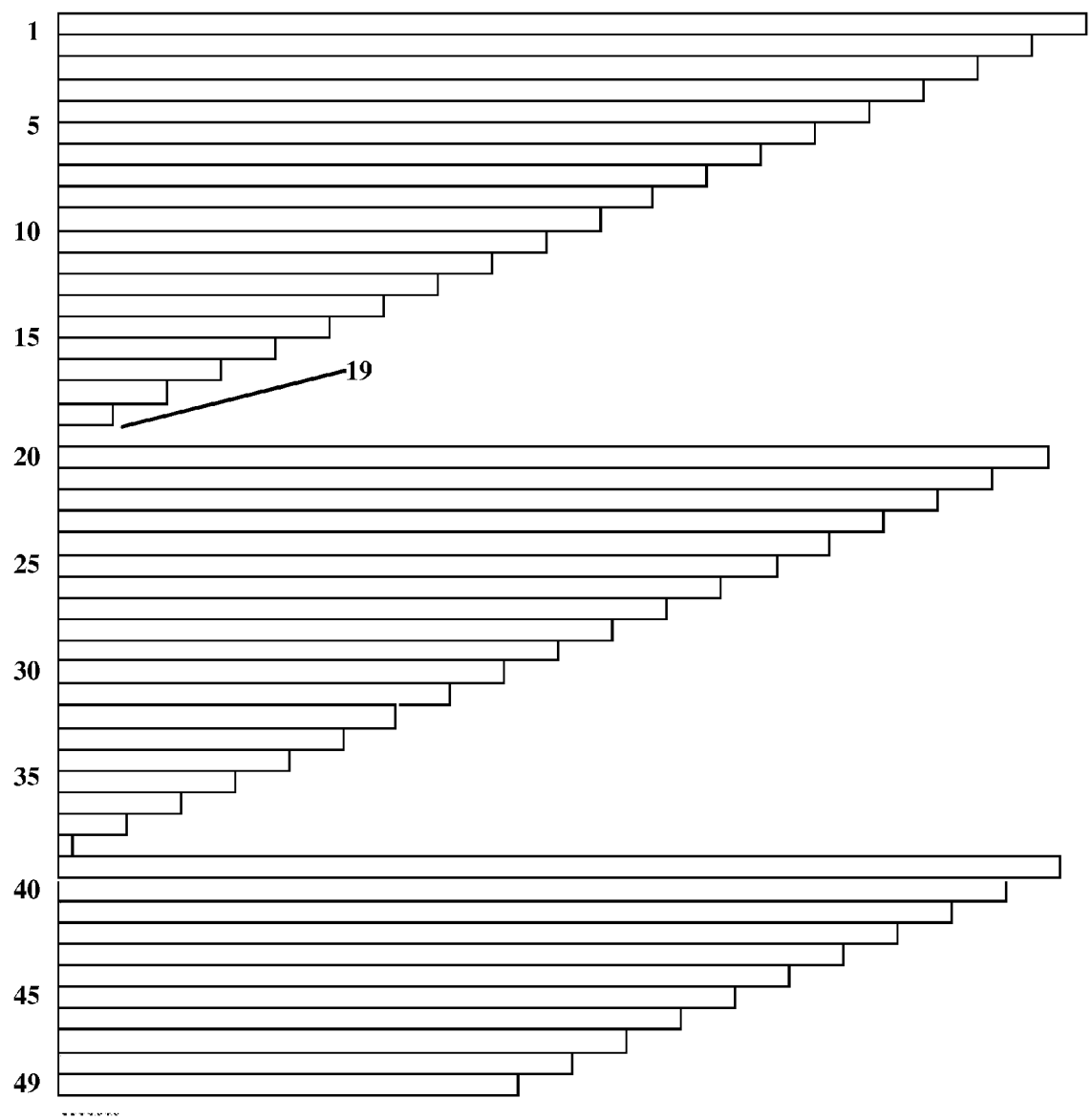
FIG. 1 illustrates a time deinterleaver buffer structure.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for reducing the complexity of interleaver design and at the same time, reduce the interleaver area. The embodiments herein achieve this by providing systems and methods for dividing the current symbol count by the buffer size corresponding to the current input carrier index, where the resulting modulo-output representing the exact intra-buffer offset. It should be also noted that Mode 1 is used as an example, and the same idea described in the disclosure can be applicable to Mode 2 and Mode 3 for both the architectures described below. Referring now to the drawings, and more particularly to FIGS. 1 through 5, where similar reference characters denote corresponding features consistently throughout the figures, there are shown preferred embodiments.

An ISDB-T transmitter employs time interleaving to randomize modulated OFDM symbol data in time domain in order to ensure robustness against fading interference. A convolutional interleaving scheme is used, in which every data carrier in an OFDM symbol is fed into a delay buffer of depth:

$$b_i = I \times ((i \times 5) \bmod 96) \qquad \text{Eq. (1)}$$

where i is the buffer index ranging from 0 to $n_c-1$, where is the number of data carriers per OFDM symbol (96, 192 or 384, depending on the system mode—respectively Mode 1, Mode 2, or Mode 3), and I is the interleaving length associated with a given OFDM transmission layer, which takes one of the following values: 0, 1, 2, 4, 8 or 16.

The operation of the convolution time deinterleaver in the ISDB-T receiver is the opposite in the sense that delay buffer depths are given by:

$$b^*_i = I \times 95 - I \times ((i \times 5) \bmod 96) \qquad \text{Eq. (2)}$$

There are a total of 95 distinct non-zero delay buffers sizes in the deinterleaver, regardless of the system mode, since the buffer depth pattern given by Eq. (2) will repeat every 96 buffers, and also $b^*_{19} = b^*_{115} = b^*_{211} = b^*_{307} = 0$, so the $19^{th}$, $115^{th}$, $211^{th}$ and $307^{th}$ data carriers in every OFDM symbol are transferred without delay.

A time deinterleaver buffer structure is illustrated in FIG. 1, showing the first 50 buffers, with the buffer depth ranging from $b^*_0 = 95$ to $b^*_{49} = 42$. As can be seen from FIG. 1, the $19^{th}$ data carrier of the OFDM symbol is transferred without delay.

Table 1 illustrates buffer allocation in a RAM for one segment in Mode 1. It should be also noted that Mode 1 is used as an example, and the same idea described herein can be applicable to Mode 2 and Mode 3. The table shows buffer sizes and buffer base addresses in the ascending order of buffer indices. There are a total of 95 distinct buffer sizes ranging from 1 to 95, 190, 380, 760 or 1520 for I=1, 2, 4, 8 or 16, respectively.

TABLE 1

| | Buffer size and Address Lookup Table | | | | | | | | | |
|---|---|---|---|---|---|---|---|---|---|---|
| BUFFER INDEX | BUFFER SIZE for interleaving length I = | | | | | BUFFER ADDRESS for interleaving length I = | | | | |
| i | 1 | 2 | 4 | 8 | 16 | 1 | 2 | 4 | 8 | 16 |
| 0 | 95 | 190 | 380 | 760 | 1520 | 0 | 0 | 0 | 0 | 0 |
| 1 | 90 | 180 | 360 | 720 | 1440 | 95 | 190 | 380 | 760 | 1520 |
| 2 | 85 | 170 | 340 | 680 | 1360 | 185 | 370 | 740 | 1480 | 2960 |
| 3 | 80 | 160 | 320 | 640 | 1280 | 270 | 540 | 1080 | 2160 | 4320 |

TABLE 1-continued

Buffer size and Address Lookup Table

| BUFFER INDEX | BUFFER SIZE for interleaving length I = | | | | | BUFFER ADDRESS for interleaving length I = | | | | |
|---|---|---|---|---|---|---|---|---|---|---|
| i | 1 | 2 | 4 | 8 | 16 | 1 | 2 | 4 | 8 | 16 |
| 4 | 75 | 150 | 300 | 600 | 1200 | 350 | 700 | 1400 | 2800 | 5600 |
| 5 | 70 | 140 | 280 | 560 | 1120 | 425 | 850 | 1700 | 3400 | 6800 |
| 6 | 65 | 130 | 260 | 520 | 1040 | 495 | 990 | 1980 | 3960 | 7920 |
| 7 | 60 | 120 | 240 | 480 | 960 | 560 | 1120 | 2240 | 4480 | 8960 |
| 8 | 55 | 110 | 220 | 440 | 880 | 620 | 1240 | 2480 | 4960 | 9920 |
| 9 | 50 | 100 | 200 | 400 | 800 | 675 | 1350 | 2700 | 5400 | 10800 |
| 10 | 45 | 90 | 180 | 360 | 720 | 725 | 1450 | 2900 | 5800 | 11600 |
| 11 | 40 | 80 | 160 | 320 | 640 | 770 | 1540 | 3080 | 6160 | 12320 |
| 12 | 35 | 70 | 140 | 280 | 560 | 810 | 1620 | 3240 | 6480 | 12960 |
| 13 | 30 | 60 | 120 | 240 | 480 | 845 | 1690 | 3380 | 6760 | 13520 |
| 14 | 25 | 50 | 100 | 200 | 400 | 875 | 1750 | 3500 | 7000 | 14000 |
| 15 | 20 | 40 | 80 | 160 | 320 | 900 | 1800 | 3600 | 7200 | 14400 |
| 16 | 15 | 30 | 60 | 120 | 240 | 920 | 1840 | 3680 | 7360 | 14720 |
| 17 | 10 | 20 | 40 | 80 | 160 | 935 | 1870 | 3740 | 7480 | 14960 |
| 18 | 5 | 10 | 20 | 40 | 80 | 945 | 1890 | 3780 | 7560 | 15120 |
| 19 | 0 | 0 | 0 | 0 | 0 | 950 | 1900 | 3800 | 7600 | 15200 |
| 20 | 91 | 182 | 364 | 728 | 1456 | 950 | 1900 | 3800 | 7600 | 15200 |
| 21 | 86 | 172 | 344 | 688 | 1376 | 1041 | 2082 | 4164 | 8328 | 16656 |
| 22 | 81 | 162 | 324 | 648 | 1296 | 1127 | 2254 | 4508 | 9016 | 18032 |
| 23 | 76 | 152 | 304 | 608 | 1216 | 1208 | 2416 | 4832 | 9664 | 19328 |
| 24 | 71 | 142 | 284 | 568 | 1136 | 1284 | 2568 | 5136 | 10272 | 20544 |
| 25 | 66 | 132 | 264 | 528 | 1056 | 1355 | 2710 | 5420 | 10840 | 21680 |
| 26 | 61 | 122 | 244 | 488 | 976 | 1421 | 2842 | 5684 | 11368 | 22736 |
| 27 | 56 | 112 | 224 | 448 | 896 | 1482 | 2964 | 5928 | 11856 | 23712 |
| 28 | 51 | 102 | 204 | 408 | 816 | 1538 | 3076 | 6152 | 12304 | 24608 |
| 29 | 46 | 92 | 184 | 368 | 736 | 1589 | 3178 | 6356 | 12712 | 25424 |
| 30 | 41 | 82 | 164 | 328 | 656 | 1635 | 3270 | 6540 | 13080 | 26160 |
| 31 | 36 | 72 | 144 | 288 | 576 | 1676 | 3352 | 6704 | 13408 | 26816 |
| 32 | 31 | 62 | 124 | 248 | 496 | 1712 | 3424 | 6848 | 13696 | 27392 |
| 33 | 26 | 52 | 104 | 208 | 416 | 1743 | 3486 | 6972 | 13944 | 27888 |
| 34 | 21 | 42 | 84 | 168 | 336 | 1769 | 3538 | 7076 | 14152 | 28304 |
| 35 | 16 | 32 | 64 | 128 | 256 | 1790 | 3580 | 7160 | 14320 | 28640 |
| 36 | 11 | 22 | 44 | 88 | 176 | 1806 | 3612 | 7224 | 14448 | 28896 |
| 37 | 6 | 12 | 24 | 48 | 96 | 1817 | 3634 | 7268 | 14536 | 29072 |
| 38 | 1 | 2 | 4 | 8 | 16 | 1823 | 3646 | 7292 | 14584 | 29168 |
| 39 | 92 | 184 | 368 | 736 | 1472 | 1824 | 3648 | 7296 | 14592 | 29184 |
| 40 | 87 | 174 | 348 | 696 | 1392 | 1916 | 3832 | 7664 | 15328 | 30656 |
| 41 | 82 | 164 | 328 | 656 | 1312 | 2003 | 4006 | 8012 | 16024 | 32048 |
| 42 | 77 | 154 | 308 | 616 | 1232 | 2085 | 4170 | 8340 | 16680 | 33360 |
| 43 | 72 | 144 | 288 | 576 | 1152 | 2162 | 4324 | 8648 | 17296 | 34592 |
| 44 | 67 | 134 | 268 | 536 | 1072 | 2234 | 4468 | 8936 | 17872 | 35744 |
| 45 | 62 | 124 | 248 | 496 | 992 | 2301 | 4602 | 9204 | 18408 | 36816 |
| 46 | 57 | 114 | 228 | 456 | 912 | 2363 | 4726 | 9452 | 18904 | 37808 |
| 47 | 52 | 104 | 208 | 416 | 832 | 2420 | 4840 | 9680 | 19360 | 38720 |
| 48 | 47 | 94 | 188 | 376 | 752 | 2472 | 4944 | 9888 | 19776 | 39552 |
| 49 | 42 | 84 | 168 | 336 | 672 | 2519 | 5038 | 10076 | 20152 | 40304 |
| 50 | 37 | 74 | 148 | 296 | 592 | 2561 | 5122 | 10244 | 20488 | 40976 |
| 51 | 32 | 64 | 128 | 256 | 512 | 2598 | 5196 | 10392 | 20784 | 41568 |
| 52 | 27 | 54 | 108 | 216 | 432 | 2630 | 5260 | 10520 | 21040 | 42080 |
| 53 | 22 | 44 | 88 | 176 | 352 | 2657 | 5314 | 10628 | 21256 | 42512 |
| 54 | 17 | 34 | 68 | 136 | 272 | 2679 | 5358 | 10716 | 21432 | 42864 |
| 55 | 12 | 24 | 48 | 96 | 192 | 2696 | 5392 | 10784 | 21568 | 43136 |
| 56 | 7 | 14 | 28 | 56 | 112 | 2708 | 5416 | 10832 | 21664 | 43328 |
| 57 | 2 | 4 | 8 | 16 | 32 | 2715 | 5430 | 10860 | 21720 | 43440 |
| 58 | 93 | 186 | 372 | 744 | 1488 | 2717 | 5434 | 10868 | 21736 | 43472 |
| 59 | 88 | 176 | 352 | 704 | 1408 | 2810 | 5620 | 11240 | 22480 | 44960 |
| 60 | 83 | 166 | 332 | 664 | 1328 | 2898 | 5796 | 11592 | 23184 | 46368 |
| 61 | 78 | 156 | 312 | 624 | 1248 | 2981 | 5962 | 11924 | 23848 | 47696 |
| 62 | 73 | 146 | 292 | 584 | 1168 | 3059 | 6118 | 12236 | 24472 | 48944 |
| 63 | 68 | 136 | 272 | 544 | 1088 | 3132 | 6264 | 12528 | 25056 | 50112 |
| 64 | 63 | 126 | 252 | 504 | 1008 | 3200 | 6400 | 12800 | 25600 | 51200 |
| 65 | 58 | 116 | 232 | 464 | 928 | 3263 | 6526 | 13052 | 26104 | 52208 |
| 66 | 53 | 106 | 212 | 424 | 848 | 3321 | 6642 | 13284 | 26568 | 53136 |
| 67 | 48 | 96 | 192 | 384 | 768 | 3374 | 6748 | 13496 | 26992 | 53984 |
| 68 | 43 | 86 | 172 | 344 | 688 | 3422 | 6844 | 13688 | 27376 | 54752 |
| 69 | 38 | 76 | 152 | 304 | 608 | 3465 | 6930 | 13860 | 27720 | 55440 |
| 70 | 33 | 66 | 132 | 264 | 528 | 3503 | 7006 | 14012 | 28024 | 56048 |
| 71 | 28 | 56 | 112 | 224 | 448 | 3536 | 7072 | 14144 | 28288 | 56576 |
| 72 | 23 | 46 | 92 | 184 | 368 | 3564 | 7128 | 14256 | 28512 | 57024 |
| 73 | 18 | 36 | 72 | 144 | 288 | 3587 | 7174 | 14348 | 28696 | 57392 |
| 74 | 13 | 26 | 52 | 104 | 208 | 3605 | 7210 | 14420 | 28840 | 57680 |
| 75 | 8 | 16 | 32 | 64 | 128 | 3618 | 7236 | 14472 | 28944 | 57888 |
| 76 | 3 | 6 | 12 | 24 | 48 | 3626 | 7252 | 14504 | 29008 | 58016 |

TABLE 1-continued

Buffer size and Address Lookup Table

| BUFFER INDEX | BUFFER SIZE for interleaving length I = | | | | | BUFFER ADDRESS for interleaving length I = | | | | |
|---|---|---|---|---|---|---|---|---|---|---|
| i | 1 | 2 | 4 | 8 | 16 | 1 | 2 | 4 | 8 | 16 |
| 77 | 94 | 188 | 376 | 752 | 1504 | 3629 | 7258 | 14516 | 29032 | 58064 |
| 78 | 89 | 178 | 356 | 712 | 1424 | 3723 | 7446 | 14892 | 29784 | 59568 |
| 79 | 84 | 168 | 336 | 672 | 1344 | 3812 | 7624 | 15248 | 30496 | 60992 |
| 80 | 79 | 158 | 316 | 632 | 1264 | 3896 | 7792 | 15584 | 31168 | 62336 |
| 81 | 74 | 148 | 296 | 592 | 1184 | 3975 | 7950 | 15900 | 31800 | 63600 |
| 82 | 69 | 138 | 276 | 552 | 1104 | 4049 | 8098 | 16196 | 32392 | 64784 |
| 83 | 64 | 128 | 256 | 512 | 1024 | 4118 | 8236 | 16472 | 32944 | 65888 |
| 84 | 59 | 118 | 236 | 472 | 944 | 4182 | 8364 | 16728 | 33456 | 66912 |
| 85 | 54 | 108 | 216 | 432 | 864 | 4241 | 8482 | 16964 | 33928 | 67856 |
| 86 | 49 | 98 | 196 | 392 | 784 | 4295 | 8590 | 17180 | 34360 | 68720 |
| 87 | 44 | 88 | 176 | 352 | 704 | 4344 | 8688 | 17376 | 34752 | 69504 |
| 88 | 39 | 78 | 156 | 312 | 624 | 4388 | 8776 | 17552 | 35104 | 70208 |
| 89 | 34 | 68 | 136 | 272 | 544 | 4427 | 8854 | 17708 | 35416 | 70832 |
| 90 | 29 | 58 | 116 | 232 | 464 | 4461 | 8922 | 17844 | 35688 | 71376 |
| 91 | 24 | 48 | 96 | 192 | 384 | 4490 | 8980 | 17960 | 35920 | 71840 |
| 92 | 19 | 38 | 76 | 152 | 304 | 4514 | 9028 | 18056 | 36112 | 72224 |
| 93 | 14 | 28 | 56 | 112 | 224 | 4533 | 9066 | 18132 | 36264 | 72528 |
| 94 | 9 | 18 | 36 | 72 | 144 | 4547 | 9094 | 18188 | 36376 | 72752 |
| 95 | 4 | 8 | 16 | 32 | 64 | 4556 | 9112 | 18224 | 36448 | 72896 |

Table 2 shows the RAM size needed for one segment in Mode 1. Each buffer entry requires the number of bits equal to the data carrier soft decision width, therefore the total amount of memory required for the time deinterleaver is the combined depth of all the buffers multiplied by the data carrier bit width. This yields a very large memory size since the total combined buffer depth for one segment in Mode 1 is 72,960 entries for I=16 (see Tables 1 and 2). If the carrier bit width is assumed to be 12 bits long, the RAM memory needed will be over 10 M bits. Many times deinterleaver architectures use 95 distinct intra-buffer offset pointers (counters) implemented as flip-flops.

TABLE 2

Total RAM Size
TOTAL RAM SIZE FOR 1 SEGMENT IN MODE 1
for interleaving length I =

| 1 | 2 | 4 | 8 | 16 |
|---|---|---|---|---|
| 4,560 | 9,120 | 18,240 | 36,480 | 72,960 |

For the simplest case of interleaving length I=1 there are 95 distinct buffer sizes ranging between 1 and 95, so for the time de-interleaving operation to be continuous (uninterrupted) the OFDM symbol counter should count up to the maximum value=LCM (least common multiple) of all natural numbers between 1 and 95, and then be reset to 0 and continue. If the larger values of the interleaving length parameter are considered, the OFDM symbol counter bit width will have to be greater than 130 bits to support the value of the above LCM, which is obviously impractical for hardware implementation.

If the worst case scenario is considered, where the shortest possible OFDM symbol length is 250 microseconds (Mode 1), the OFDM symbol counter gets incremented every 250 microseconds. If we consider realistic TV watching time, after which the user will switch to another channel or turn off the receiver, a practical value of bit width for the OFDM symbol counter can be used.

Table 3 shows the performance of 1 to 33-bit OFDM symbol counter in a receiver in terms of the maximum run time before the counter overflow occurs.

TABLE 3

Maximum runtimes of OFDM symbol counter

| OFDM Symbol Counter Bits | Mode 1 0.00025 s/symbol | Mode 2 0.0005 s/symbol | Mode 3 0.001 s/symbol |
|---|---|---|---|
| 1 | 0.001 | 0.001 | 0.002 |
| 2 | 0.001 | 0.002 | 0.004 |
| 3 | 0.002 | 0.004 | 0.008 |
| 4 | 0.004 | 0.008 | 0.016 |
| 5 | 0.008 | 0.016 | 0.032 |
| 6 | 0.016 | 0.032 | 0.064 |
| 7 | 0.032 | 0.064 | 0.128 |
| 8 | 0.064 | 0.128 | 0.256 |
| 9 | 0.128 | 0.256 | 0.512 |
| 10 | 0.256 | 0.512 | 1.024 |
| 11 | 0.512 | 1.024 | 2.048 |
| 12 | 1.024 | 2.048 | 4.096 |
| 13 | 2.048 | 4.096 | 8.192 |
| 14 | 4.096 | 8.192 | 16.384 |

TABLE 3-continued

Maximum runtimes of OFDM symbol counter

| OFDM Symbol Counter Bits | Mode 1 0.00025 s/symbol | Mode 2 0.0005 s/symbol | Mode 3 0.001 s/symbol | | | | |
|---|---|---|---|---|---|---|---|
| 15 | 8.192 | 16.384 | 32.768 | | | | |
| 16 | 16.384 | 32.768 | 65.536 | | | | |
| 17 | 32.768 | 65.536 | 131.072 | | | | |
| 18 | 65.536 | 131.072 | 262.144 | | | | |
| 19 | 131.072 | 262.144 | 524.288 | | | | |
| 20 | 262.144 | 524.288 | 1,048.576 | | | | |
| 21 | 524.288 | 1,048.576 | 2,097.15 | | | | |
| 22 | 1,048.576 | 2,097.152 | 4,194.304 | | | | |
| 23 | 2,097.152 | 4,194.304 | 8,388.608 | | 0 | 0 | 0.1 |
| 24 | 4,194.304 | 8,388.608 | 16,777.216 | | 0 | 0.1 | 0.2 |
| 25 | 8,388.608 | 16,777.216 | 33,554.432 | | 0.1 | 0.2 | 0.4 |
| 26 | 16,777.216 | 33,554.432 | 67,108.864 | | 0.2 | 0.4 | 0.8 |
| 27 | 33,554.432 | 67,108.864 | 134,217.728 | | 0.4 | 0.8 | 1.6 |
| 28 | 67,108.864 | 134,217.728 | 268,435.456 | | 0.8 | 1.6 | 3.1 |
| 29 | 134,217.72 | 268,435.456 | 536,870.912 | | 1.6 | 3.1 | 6.2 |
| 30 | 268,435.46 | 536,870.912 | 1,073,741.824 | | 3.1 | 6.2 | 12.4 |
| 31 | 536,870.912 | 1,073,741.824 | 2,147,483.648 | | 6.2 | 12.4 | 24.9 |
| 32 | 1,073,741.824 | 2,147,483.648 | 4,294,967.296 | | 12.4 | 24.9 | 49.7 |
| 33 | 2,147,483.648 | 4,294,967.296 | 8,589,934.592 | seconds | 24.9 | 49.7 | 99.4 | days |

For mode 1, the counter width of 29 bits corresponds to more than one day of TV viewing and 33 bits corresponds to about a month of TV viewing time. The OFDM symbol counter is reset to zero upon reaching the end of the current TV viewing period.

Figure 2:
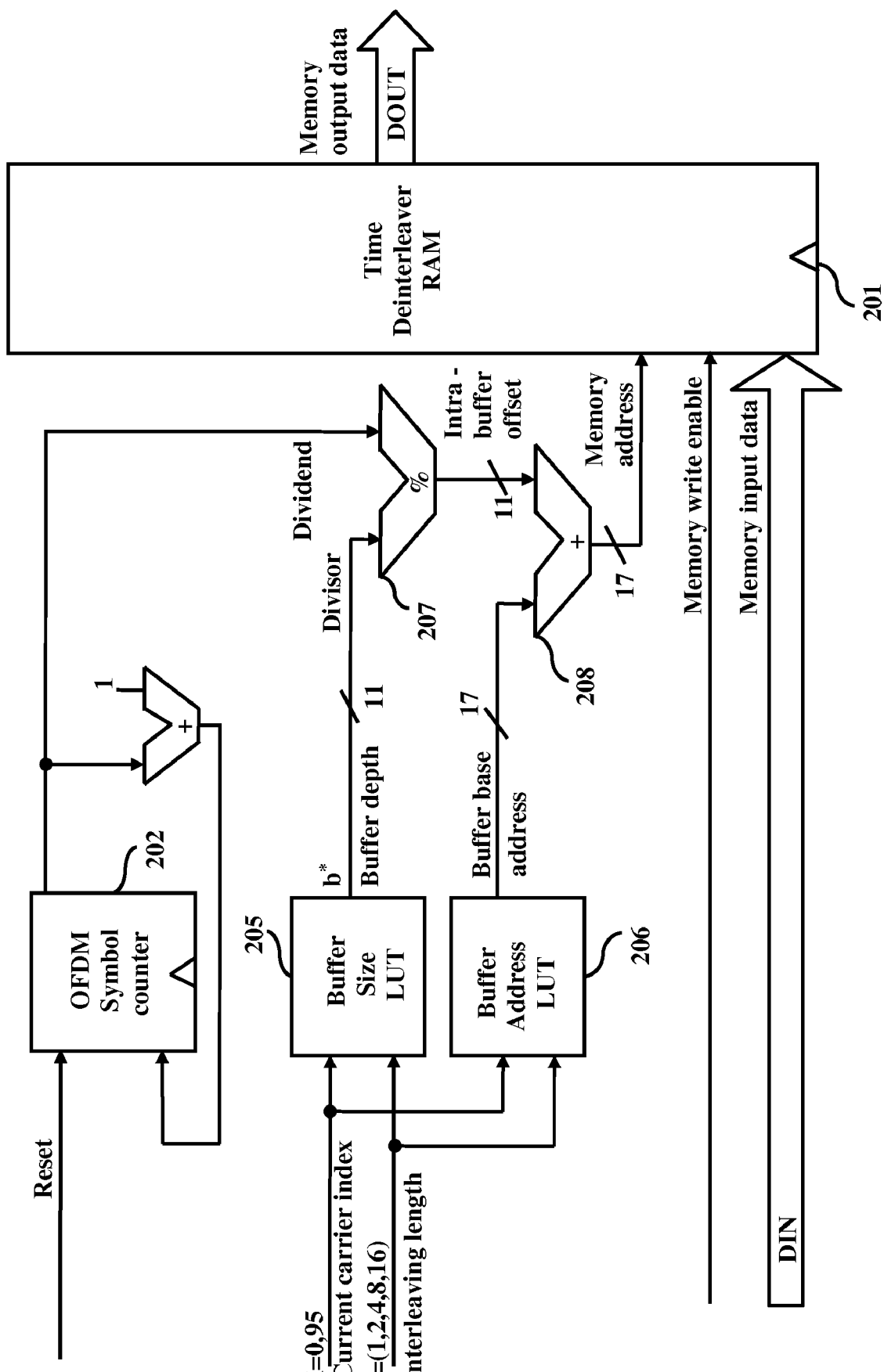
FIG. 2 illustrates a schematic diagram of a modulo based pointer architecture in a time deinterleaver ISDB-T receiver according to an embodiment herein.

FIG. 2 shows a modulo based pointer architecture in a time deinterleaver ISDB-T receiver. The architecture is described for Mode 1 where there are 96 data carriers per OFDM symbol. However, one skilled in the art would easily realize that Mode 1 is used only as an example and is not a restriction of the various embodiments as disclosed herein. It should be also noted that Mode 1 is used as an example, and the same idea described in the disclosure can be applicable to Mode 2 and Mode 3.

There are 95 de-interleaving delay buffers and one zero delay buffer in the receiver. The architecture comprises a time deinterleaver random access memory 201 where the deinterleaver buffers are stored, a OFDM symbol counter 202, a divider 207, a first lookup table (LUT) 205 for obtaining delay buffer sizes of 95 delay buffers, a second lookup table (LUT) 206 for obtaining buffer base addresses of 95 delay buffers. In different embodiments, the lookup tables 205, 206 can be implemented as a read-only memory (ROM) or using dynamic arithmetic calculations. The OFDM symbol counter 202 increments for each OFDM symbol, with bit width of OFDM symbol counter varying from 23-33 bits, while in practical applications the bit width of said OFDM symbol counter varies from 25-30 bits. The modulo divider 207 calculates the intra buffer offset for each carrier by dividing the OFDM symbol counter 202 value with the delay buffer size of the corresponding carrier obtained from the first LUT 205. The size of the dividend is 23 to 33 bits and the divisor size is up to 11 bits. The divider may be embodied as a combinational divider or a sequential divider. The adder 208 combines the intra buffers offset and buffer base address from the second LUT 206 to calculate the memory address where the input data gets stored in the time deinterleaver RAM 201.

Figure 3:
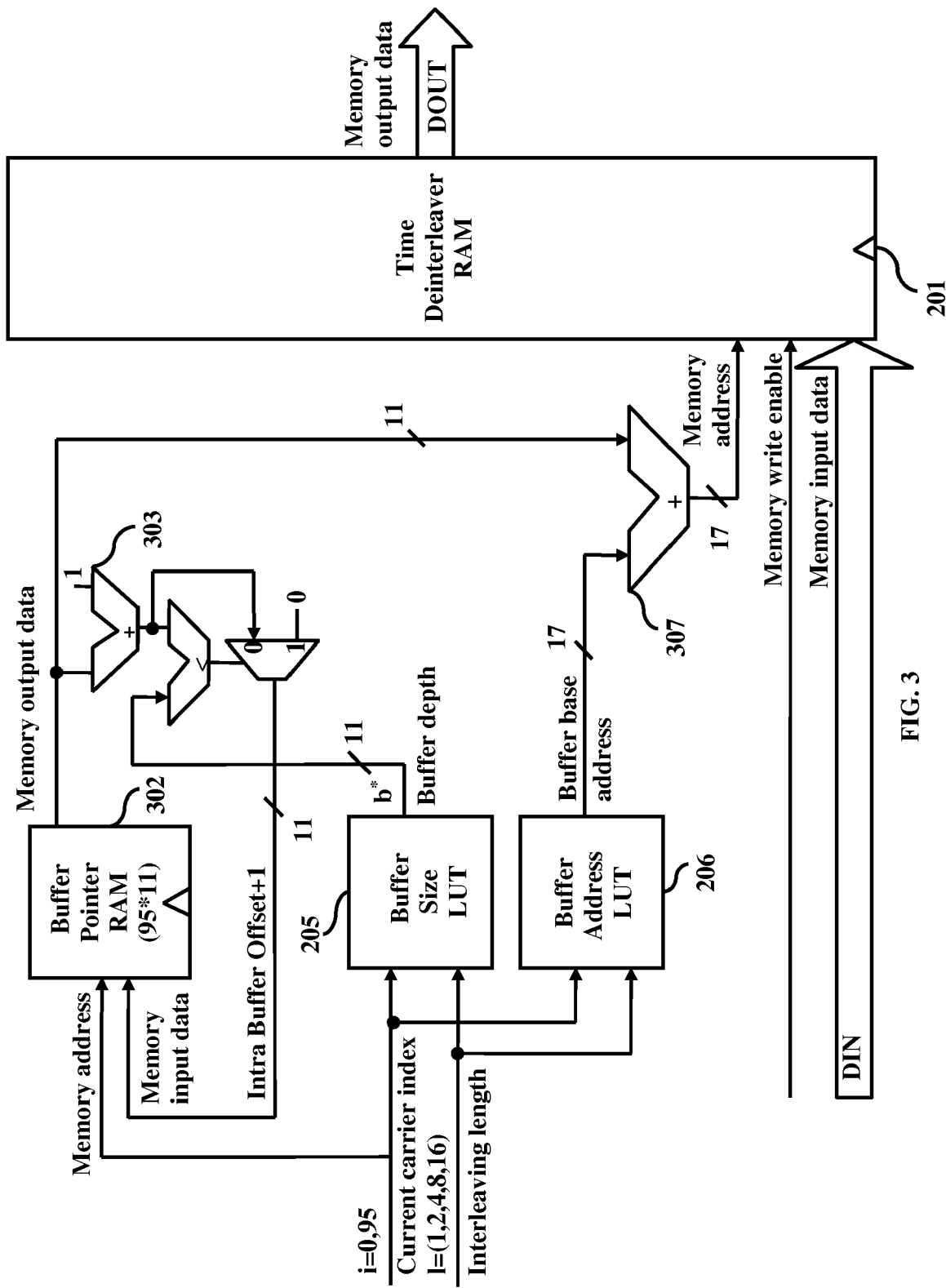
FIG. 3 illustrates a schematic diagram of a memory based pointer architecture in a time deinterleaver ISDB-T receiver according to an embodiment herein.

FIG. 3 illustrates memory based pointer architecture in a time deinterleaver ISDB-T receiver. The architecture is described for Mode 1 where there are 96 data carriers per OFDM symbol. However, one skilled in the art would easily realize that Mode 1 is used only as an example and is not a restriction of the various embodiments as disclosed herein. It should be also noted that Mode 1 is used as an example, and the same idea described in the disclosure can be applicable to Mode 2 and Mode 3. There are 95 de-interleaving delay buffers and one zero delay buffer in the receiver. The architecture comprises a time deinterleaver RAM 201, a buffer pointer RAM 302, a first LUT 205 for obtaining delay buffer sizes of 95 delay buffers, a second LUT 206 for obtaining for obtaining buffer base addresses of 95 delay buffers. The buffer pointer RAM 302 stores the 95 delay buffer pointer values. The buffer pointer works with a circular pointer logic. For each data carrier the corresponding pointer value is read from the buffer pointer RAM 302, circularly incremented using an adder 303 and written back to the buffer pointer RAM 302. Adder 307 combines the intra buffers offset and buffer base address from the second LUT 206 to calculate the memory address where the input data gets stored in the time deinterleaver RAM 201. In different embodiments, the lookup tables 205, 206 can be implemented as a ROM or using dynamic arithmetic calculations.

Figure 4:
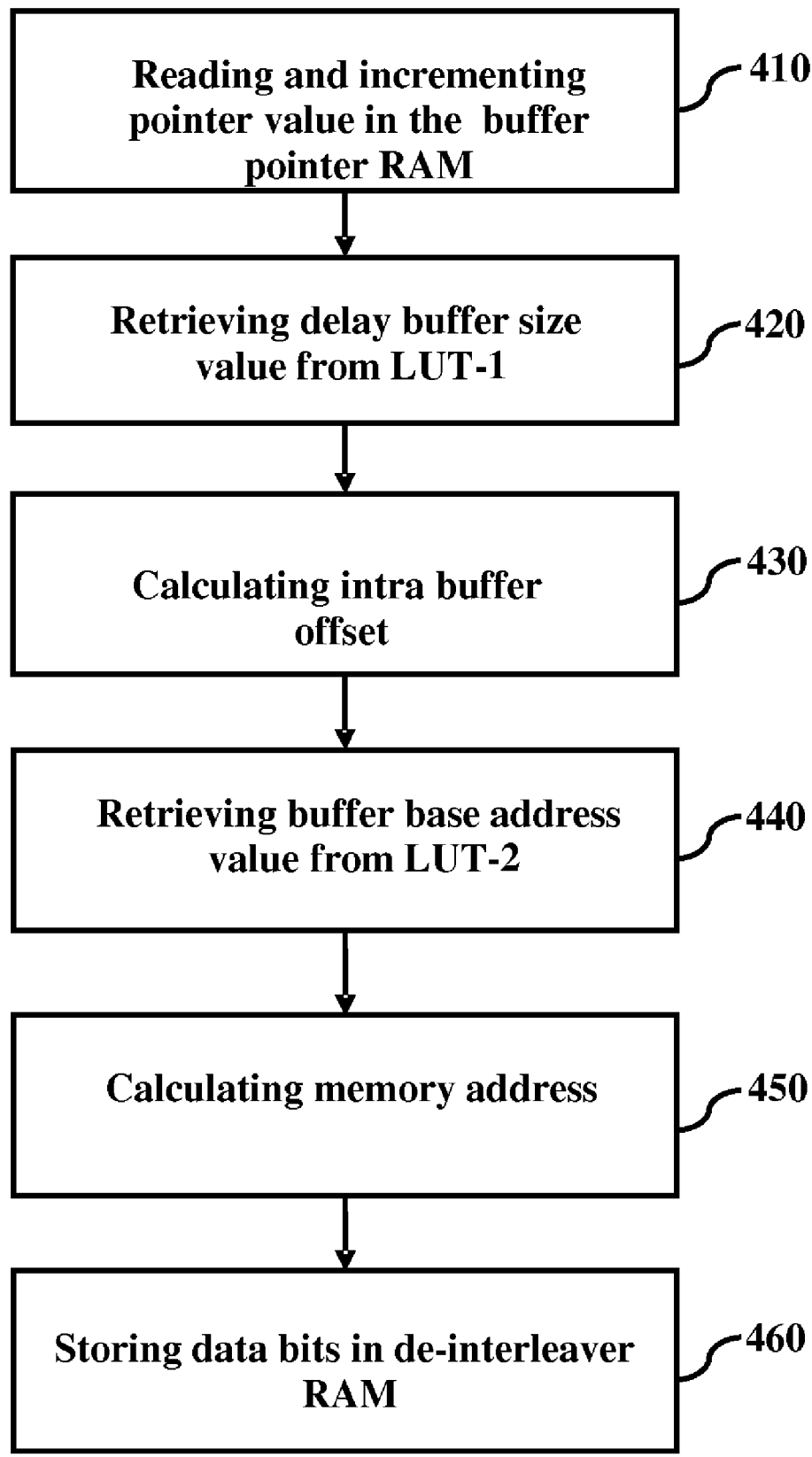
FIG. 4 is a flow diagram illustrating a method according to a first embodiment herein.

FIG. 4, with reference to FIGS. 1 and 2, illustrates a method for de-interleaving interleaved data using memory based pointer architecture in accordance with the first embodiment herein. The method begins at step 410, where for each data carrier the corresponding pointer value is read from the buffer pointer RAM 302 and incremented using adder 303. The incremented value is stored back in the buffer pointer RAM 302. At step 420 the delay buffer size value of the corresponding carrier is retrieved from the first LUT 205. The incremented pointer value is compared with the retrieved buffer size value using circular increment logic to calculate the intra buffer offset at step 430. Circular increment logic involves adding '1' to the incremented pointer value and comparing the new pointer value with the retrieved buffer size value. If the new value exceeds the buffer size, the new pointer value is zeroed out. At step 440, the buffer base address value of the corresponding carrier is retrieved from the second LUT 206. The memory address where the input data needs to be stored is calculated by adding the intra buffer offset to the retrieved buffer base address at step 450. Finally, at step 460, the data bits get stored in the deinterleaver RAM 201.

Figure 5:
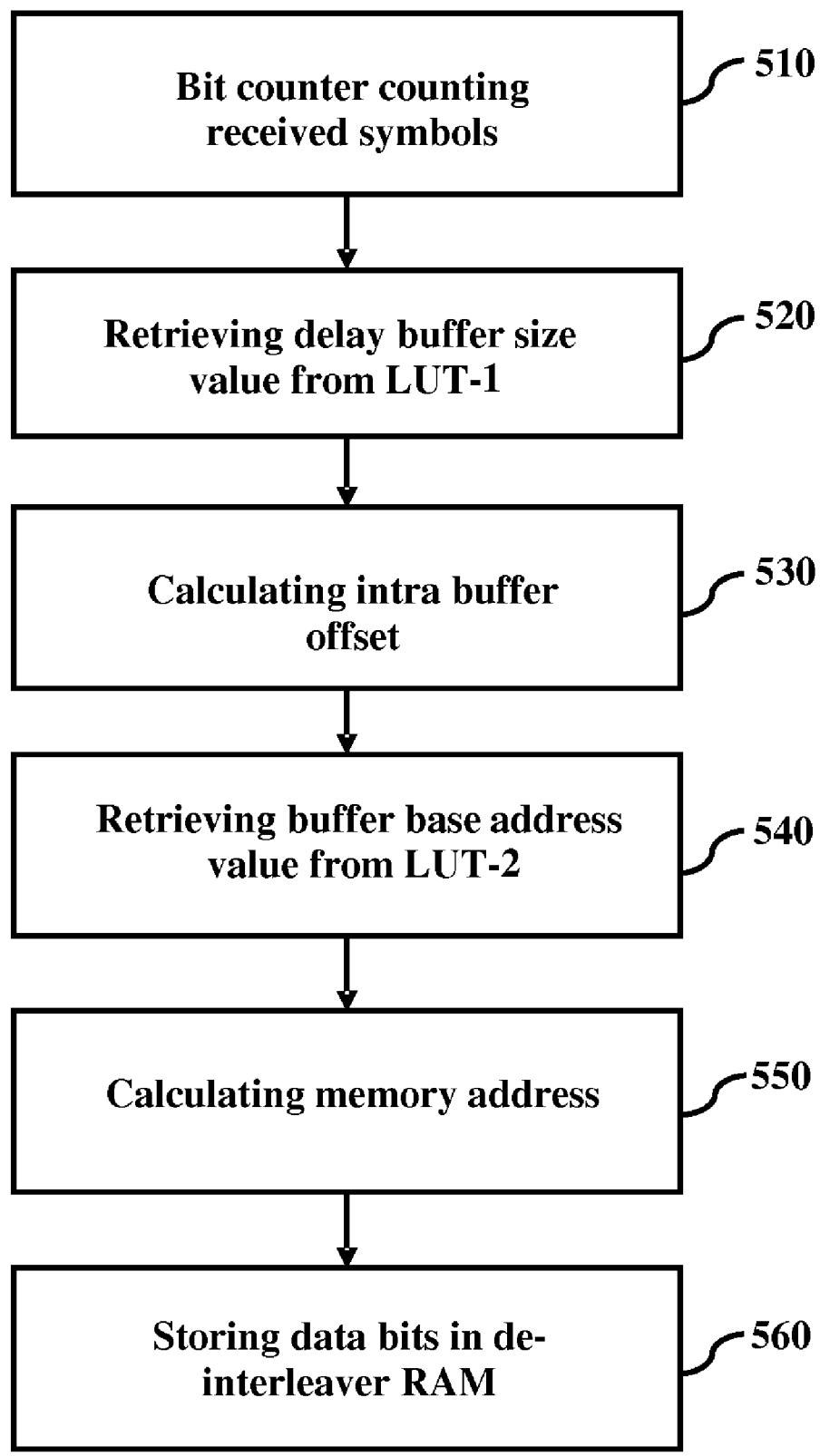
FIG. 5 is a flow diagram illustrating a method according to a second embodiment herein.

FIG. 5, with reference to FIGS. 1 and 3, illustrates a method for de-interleaving interleaved data using modulo based pointer architecture in accordance with the second embodiment herein. The method begins at step 510, where OFDM symbol counter 202 counts each received symbol. At step 520 the delay buffer size value of the corresponding carrier is retrieved from the first LUT 205. The intra buffer offset is calculated by dividing the OFDM symbol counter with retrieved delay buffer size value at step 530 using modulo divider 207. At step 540, the buffer base address value of the corresponding carrier is retrieved from the second LUT 206. The memory address where the input data needs to be stored is calculated by adding the intra buffer offset to the retrieved buffer base address at step 550. The data bits get stored in the deinterleaver RAM 201 at step 560.

Figure 6:
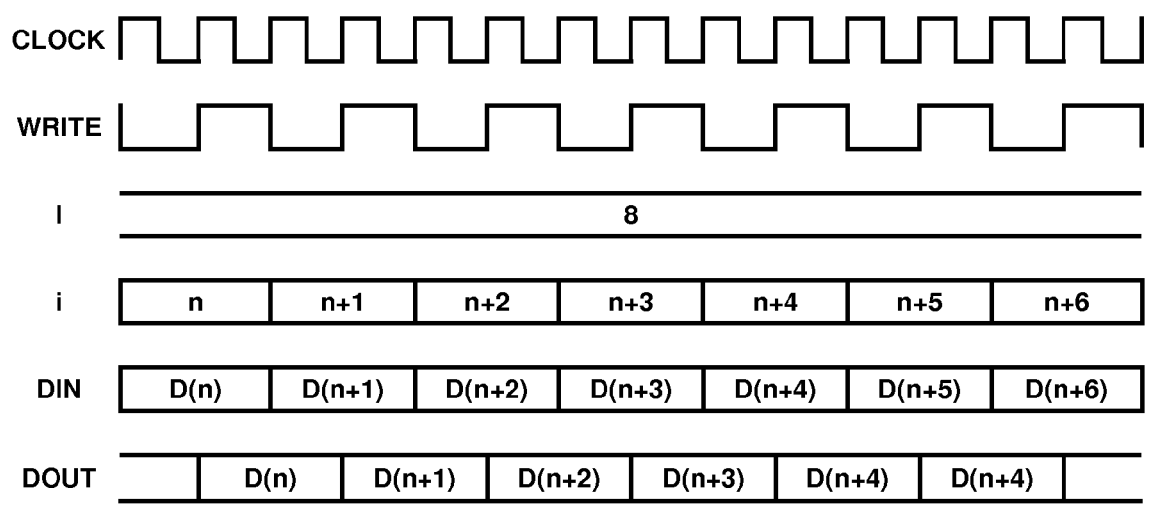
FIG. 6 illustrates test data input and output timing for various embodiments herein.

FIG. 6 illustrates the test data input timing for both the modulo based pointer architecture of FIG. 2 and the memory based pointer architecture of FIG. 3. The incoming data carriers (DIN) are two clock cycles apart. The interleaving length is equal to 8. However, one skilled in the art would easily realize that an interleaving length of 8 is used as an example and is not a restriction of the embodiments as disclosed herein. Data is written into the deinterleaver RAM 201 every two-clock cycles apart. DOUT represents the data as taken out of the deinterleaver RAM 201. If the incoming data is spaced many cycles apart, the size of modulo based architecture can be reduced by making the divider a sequential divider.

The architectures provided by the embodiments herein and illustrated in FIGS. 2 and 3 results in chip area savings compared with the conventional architectures. Using an example of 0.13 um standard cell technology, one scan flip-flop is roughly 40 um$^2$, so for conventional design the 95×11 flip-flops alone will occupy up to 40,000 um$^2$. One example of sequential divider implementation with a 25-30 bit dividend is 7,000-10,000 um$^2$, plus an OFDM symbol counter of 1000-1200 um2, so the equivalent design saves about 30,000 um$^2$. For a memory-based design, a 95×11 RAM is on average 5,000-7,000 um$^2$, plus additional adder logic plus memory built-in self-test (BIST) overhead, so the equivalent design is under 10,000 um$^2$, which also saves around 30,000 um$^2$. Hence assuming that the rest of the architecture (buffer size LUT, buffer address LUT and memory address calculation logic) is the same between existing art and the proposed architectures, chip area for the intra-buffer pointer storage and calculation requires reduction.

The techniques provided by the embodiments herein may be implemented on an integrated circuit chip (not shown) and may be used in digital video broadcast systems for handheld devices, and implemented in the baseband chip sets. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of an entirely hardware embodiment, an entirely software embodiment or an embodiment including both hardware and software elements. The embodiments that are implemented in software include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

Therefore, while the embodiments herein have been described in terms of preferred embodiments, those skilled in the art will recognize that the embodiments herein can be practiced with modification within the spirit and scope of the appended claims.

What is claimed is:

1. An apparatus for de-interleaving interleaved data in an Orthogonal Frequency Division Multiplexing (OFDM) based receiver, said apparatus comprising:
   a deinterleaver memory;
   a buffer pointer random access memory (RAM) adapted to store buffer pointer values, said buffer pointer RAM comprising circular pointer increment logic;
   a first lookup table in said deinterleaver memory for obtaining delay buffer sizes for various carriers and interleaving lengths for a given OFDM transmission layer; and
   a second lookup table in said deinterleaver memory for obtaining buffer base addresses for various carriers and interleaving lengths for a given OFDM transmission layer,
   wherein a buffer pointer RAM size is chosen based on uninterrupted television viewing time on a particular channel.

2. The apparatus of claim 1, wherein said buffer pointer RAM comprises a 95×11 RAM.

3. The apparatus of claim 1, wherein the first and second lookup tables are implemented as a read-only memory (ROM).

4. The apparatus of claim 1, wherein the first and second lookup tables are implemented using dynamic arithmetic calculations.

5. The apparatus of claim 1, wherein said receiver comprises a mobile television receiver.

6. The apparatus of claim 1, wherein said receiver comprises an Integrated Services Digital Broadcasting Terrestrial (ISDB-T) receiver.

7. A method of de-interleaving interleaved data on a deinterleaver memory component in an Orthogonal Frequency Division Multiplexing (OFDM) based receiver using a buffer pointer random access memory (RAM) and circular pointer logic, a first lookup table to obtain delay buffer sizes for various carriers and interleaving lengths for a given OFDM transmission layer, and a second lookup table to obtain buffer base address and interleaving lengths for a given OFDM transmission layer, said method comprising:
   reading a pointer value for a corresponding carrier from said buffer pointer RAM;
   incrementing the read pointer value;
   retrieving a buffer size value for said corresponding carrier from said first lookup table;
   calculating intra buffer offset for a carrier by comparing said buffer size with said incremented pointer value;
   retrieving a buffer base address value for corresponding carrier from said second lookup table;
   adding calculated intra buffer offset to said buffer base address to calculate a memory address to store carrier data bits of the corresponding carrier; and
   storing said carrier data bits at said calculated memory address.

8. The method of claim 7, wherein said buffer pointer RAM comprises 96 stored pointer values.

9. The method of claim 7, wherein the first and second lookup tables are implemented as a read-only memory (ROM).

10. The method of claim 7, wherein the first and second lookup tables are implemented using dynamic arithmetic calculations.

11. The method of claim 7, wherein the delay buffer sizes and buffer base addresses are obtained for various carriers and interleaving lengths for a given OFDM transmission layer from the first and second lookup table respectively.

12. The method of claim 7, wherein said receiver comprises a mobile television receiver.

13. The method of claim 7, wherein said receiver comprises an Integrated Services Digital Broadcasting Terrestrial (ISDB-T) receiver.

14. A system for de-interleaving interleaved data on a deinterleaver memory component in an Orthogonal Frequency Division Multiplexing (OFDM) based receiver using a buffer pointer random access memory (RAM) and circular pointer logic, a first lookup table to obtain delay buffer sizes for various carriers and interleaving lengths for a given OFDM transmission layer, and a second lookup table to obtain buffer base address and interleaving lengths for a given OFDM transmission layer, said system comprising:
   means for reading a pointer value for a corresponding carrier from said buffer pointer RAM;
   means for incrementing the read pointer value;
   means for retrieving a buffer size value for said corresponding carrier from said first lookup table;
   means for calculating intra buffer offset for a carrier by comparing said buffer size with said incremented pointer value;
   means for retrieving a buffer base address value for corresponding carrier from said second lookup table;
   means for adding calculated intra buffer offset to said buffer base address to calculate a memory address to store carrier data bits of the corresponding carrier; and
   means for storing said carrier data bits at said calculated memory address.

15. The system of claim 14, wherein said buffer pointer RAM comprises 96 stored pointer values.

16. The system of claim 14, wherein the first and second lookup tables are implemented as a read-only memory (ROM).

17. The system of claim 14, wherein the first and second lookup tables are implemented using dynamic arithmetic calculations.

18. The system of claim 14, wherein the delay buffer sizes and buffer base addresses are obtained for various carriers and interleaving lengths for a given OFDM transmission layer from the first and second lookup table respectively.

19. The system of claim 14, wherein said receiver comprises a mobile television receiver.

20. The system of claim 14, wherein said receiver comprises an Integrated Services Digital Broadcasting Terrestrial (ISDB-T) receiver.

* * * * *